(12) United States Patent
Anderson et al.

(10) Patent No.: US 6,625,795 B1
(45) Date of Patent: *Sep. 23, 2003

(54) METHOD AND APPARATUS FOR PLACEMENT OF INPUT-OUTPUT DESIGN OBJECTS INTO A PROGRAMMABLE GATE ARRAY

(75) Inventors: Jason H. Anderson, Campbell, CA (US); James L. Saunders, Sunnyvale, CA (US); Madabhushi V. R. Chari, Milpitas, CA (US); Sudip K. Nag, San Jose, CA (US); Rajeev Jayaraman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 09/866,052

(22) Filed: May 25, 2001

Related U.S. Application Data (63) Continuation-in-part of application No. 09/107,022, filed on Jun. 29, 1998, now Pat. No. 6,289,496.

(51) Int. Cl.⁷ .............................................. G06F 17/50
(52) U.S. Cl. .............................. 716/16; 716/17; 326/39
(58) Field of Search .............................. 710/52; 326/50, 326/37, 39, 41, 47; 438/688; 700/178; 716/16, 17

(56) References Cited

U.S. PATENT DOCUMENTS

| | | |
|---|---|---|
| 5,006,991 A | 4/1991 | Ohcoshi et al. |
| 5,843,842 A | 12/1998 | Lee et al. |
| 5,877,632 A | 3/1999 | Goetting et al. |
| 5,958,026 A | 9/1999 | Goetting et al. |
| 6,289,496 B1 * | 9/2001 | Anderson et al. ............. 716/16 |

OTHER PUBLICATIONS

Naveed Sherwani in "Algorithms for VLSI Physical Design Automation", Second Edition, published by Kluwer Academic Publishers, 1997, pp. 175–198.

S. Kirkpatrick et al., "Optimization by Simulation Annealing", Science 220:671–680, May 1983.

Thomas H. Cormen et al., "Introduction to Algorithms", McGraw Hill, 1990, pp. 600–604.

Robert Endre Tarjan, "Data Structures and Network Algorithms", Society of International Applied Mathematics, 1983, pp. 113–123.

* cited by examiner

*Primary Examiner*—Sara Crane
(74) *Attorney, Agent, or Firm*—LeRoy D. Maunu; Edel M. Young; Justin Liu (57) ABSTRACT

A method and apparatus for placement into a programmable gate array of I/O design objects having different I/O attributes. The I/O attributes of an I/O design object define the electrical characteristics of the design object. The programmable gate array has a plurality of sites (IOBs) arranged into banks supporting a variety of electrical interface characteristics. In an example embodiment, I/O design objects are placed into IOBs of the programmable gate array by first performing simulated annealing that considers conflicts between I/O attributes of I/O design objects as placed into the IOBs. Then, a bipartite matching is performed using placement results from simulated annealing. Finally, if the bipartite matching does not produce a feasible placement, sets of I/O attributes are assigned to the banks based on the previous placement results, and the bipartite matching process is repeated.

10 Claims, 5 Drawing Sheets

METHOD AND APPARATUS FOR PLACEMENT OF INPUT-OUTPUT DESIGN OBJECTS INTO A PROGRAMMABLE GATE ARRAY

RELATED APPLICATION/PATENT

The present application is a continuation-in-part of the application entitled, "METHOD AND APPARATUS FOR PLACEMENT OF INPUT-OUTPUT DESIGN OBJECTS INTO A PROGRAMMABLE GATE ARRAY", to Anderson et al., filed on Jun. 29, 1998, and having application Ser. No. 09/107,022, now U.S. Pat. No. 6,289,496.

FIELD OF THE INVENTION

The present invention generally relates to placement of input/output (I/O) design objects into programmable gate arrays, and more particularly to placement of I/O design objects that use multiple I/O standards or that have different electrical characteristics into a single programmable gate array.

BACKGROUND OF THE INVENTION

Field programmable gate arrays (FPGAs), first introduced by XILINX in 1985, are becoming increasingly popular devices for use in electronics systems. For example, communications systems employ FPGAs in large measure because of the re-programmability of FPGAs. In general, the use of FPGAs continues to grow at a rapid rate because they permit relatively short design cycles, reduce costs through logic consolidation, and offer flexibility in their re-programmability.

FPGAs generally have logic blocks in the interior of the chip and input/output blocks (IOBs) around the edges of the chip. Recently, FPGAs have been developed that also have IOBs in the interior of the chip. The IOBs send and receive signals off and into the chip and also serve other purposes such as receiving power and ground reference voltages from off the chip. One or more clock signals may also be received for synchronizing signals generated on the chip with other signals off the chip.

The systems in which FPGAs are integrated often have diverse electrical interface characteristics. The increasing capabilities of FPGAs make FPGAs a logical choice for implementing an increasing share of system functionality and interfacing with a variety of devices in the system. Thus, FPGAs have been developed to interface with devices having different electrical interface characteristics. For example, the IOBs of an FPGA, such as Virtex FPGAs from Xilinx, are configurable to operate according to a variety of different I/O standards. Therefore, it is desirable to automatically map a user's input and output design objects to IOBs of the FPGA in a manner that is consistent with the electrical interface requirements.

A method and apparatus that address the aforementioned problems, as well as other related problems, are therefore desirable.

SUMMARY OF THE INVENTION

The invention provides a method and apparatus for placement of I/O design objects into IOBs of a programmable gate array.

The IOBs of the programmable gate array are arranged in a plurality of banks. The IOBs are configurable to send and receive signals according to a variety of different I/O standards and with a variety of different electrical characteristics. The different I/O standards and electrical characteristics limit which I/O design objects can be placed in the same bank. Only I/O design objects that have "compatible" attributes may be placed together in the same bank. The attributes of an I/O design object define its electrical characteristics and generally depend on the I/O standard used by the I/O design object as well as other criteria. I/O design objects that have compatible attributes are said to be compatible with one another. Compatible I/O design objects can be placed together in the same bank. In one embodiment, sets of compatible I/O design objects are selected. The sets of compatible I/O design objects are then placed into banks while minimizing a placement cost and ensuring that no two I/O design objects having incompatible attributes are placed within a single bank.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon seeing the following detailed description and upon reference to the drawings in which.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intent is to cover all modifications, equivalents, and alternatives falling within the spirit and scope of the invention as defined by the appended claims.

DETAILED DESCRIPTION OF THE DRAWINGS

The present invention is believed to be applicable to a variety of systems for placing design objects into programmable logic devices. The present invention has been found to be particularly applicable and beneficial in placing input/output (I/O) design objects into input/output blocks (IOBS) of a field programmable gate array (FPGA). While the present invention is not so limited, an appreciation of the present invention is presented by way of a particular example application, in this instance, in the context of an example method and apparatus for placing I/O design objects into an FPGA.

The process for implementing a user's design in an FPGA begins with specifying the user's design in machine readable format, for example with a schematic entry tool, VHDL design description, or other design entry method. Software then partitions the user's design into units that can be implemented by logic blocks and input/output blocks (IOBs) of the FPGA, places these units into particular logic blocks or IOBS, and selects metal lines that route signals from one logic block or IOB to another, in order to implement the interconnections of the user's design. The final step after placing I/O and other design objects into IOBs and logic blocks of an FPGA and selecting routing lines to interconnect the objects is to generate a bitstream to be loaded into the FPGA to turn on transistors that program the FPGA to implement the design. The process for generating a programming bitstream is accomplished with generally recognized software tools, running on various classes of computer systems that assist and automate various parts of the process. Thus it can be seen that the present invention (to place I/O design objects into the IOBs of the FPGA) relates to an intermediate part of the overall process.

I/O design objects include input objects, output objects, and input/output (bidirectional) objects generated from a user's design specification, as will be recognized by those skilled in the art. An input design object is a design object through which signals are input to the FPGA, an output design object is a design object through which signals are output from the FPGA, and an input/output (or bidirectional) design object is a design object through which signals are input and output to and from the FPGA. Input design objects, output design objects, and bidirectional design objects are collectively referred to as "I/O design objects" in this application.

The electrical characteristics of an I/O design object are defined by its attributes. For example, some I/O standards require the use of differential signaling. An input design object using one of such standards has a $V_{REF}$ attribute that indicates a reference voltage that must be supplied to the I/O design object. Some I/O design objects that use a particular I/O standard must be powered by a specific supply voltage, called $V_{CCO}$. Such I/O design objects have a $V_{CCO}$ attribute. Other attributes of I/O design objects include, for example, parameters that control input and output impedance. It will be appreciated that as new FPGAs are developed, the IOBs of such devices will have additional configurable characteristics from which will arise different attributes. The embodiments of the invention described herein remain suitable for the placement of I/O design objects on IOBs of such new FPGAs.

There are rules pertaining to the I/O design objects that may be placed together in the same bank. Specifically, each bank of IOBs has attributes that control the electrical characteristics of the IOBs in the bank. To legally place an I/O design object in a bank, the attributes of the bank must be set in a way that is compatible with attributes of the I/O design object. For example, in the Xilinx Virtex FPGA, one of the attributes of a bank is its $V_{REF}$ voltage. If the $V_{REF}$ attribute of a bank were set to a specific value, for example 2.5 volts, it would not be acceptable to place an I/O design object in the bank if the design object had a $V_{REF}$ attribute other than 2.5 volts. When it is not possible to set the attributes of a bank in such a way that it can accommodate two particular I/O design objects, then these two I/O design objects are "incompatible" because their I/O attributes are not compatible. Incompatible design objects are said to "conflict".

In addition to the compatibility rules outlined above, a desirable placement of I/O design objects has acceptable wireability, wire length, and timing characteristics. Processes for measuring the wireability, wire length, timing and other characteristics are generally recognized by those skilled in the art. For example, Naveed Sherwani in "Algorithms for VLSI Physical. Design Automation" published by Kluwer Academic Publishers, 1997 describes general methods for ascertaining the quality of a placement.

Figure 1:
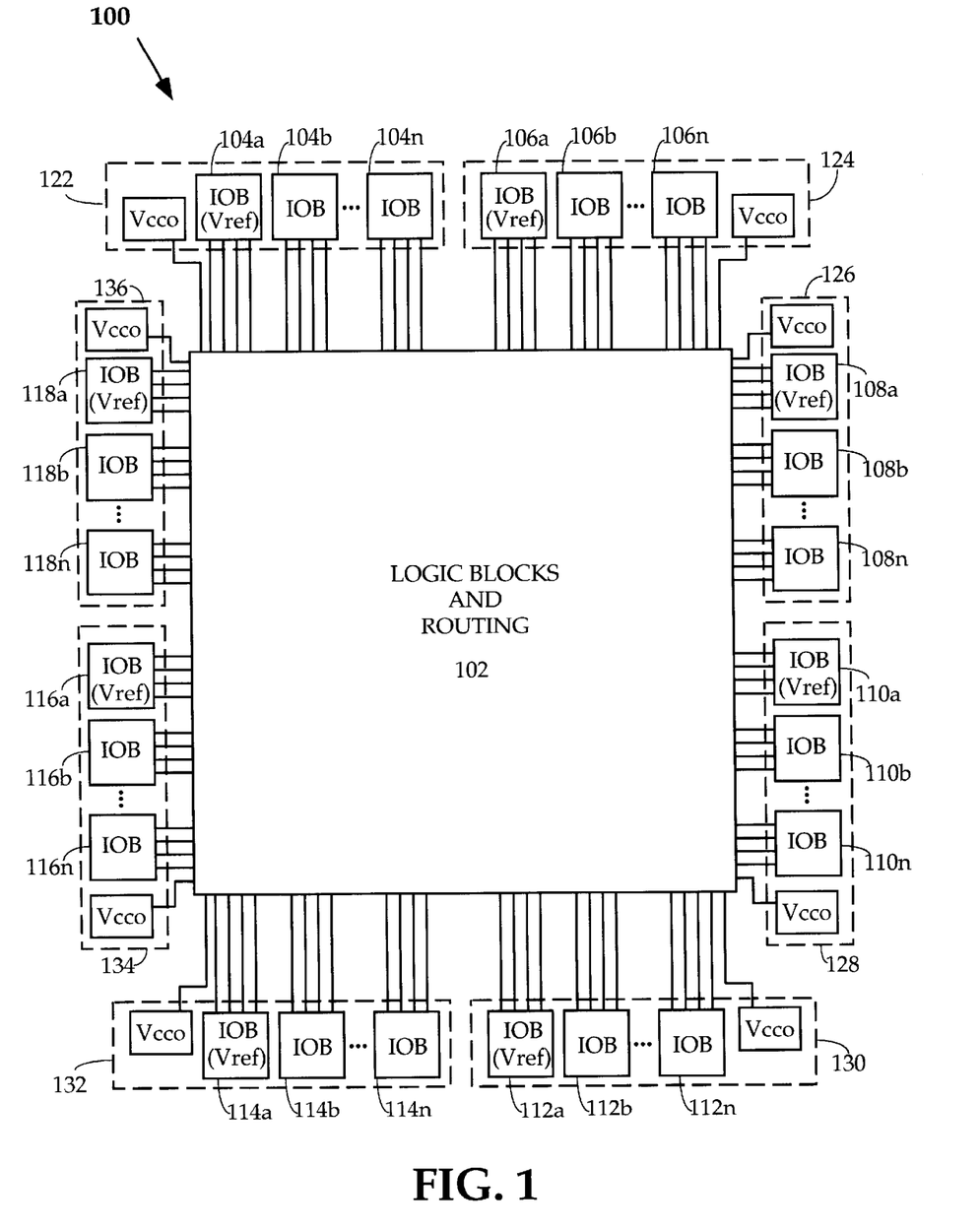
FIG. 1 is a block diagram of an example FPGA.

FIG. 1 is a block diagram of an example FPGA, such as the Virtex FPGA from XILINX, Inc. FPGA 100 includes section 102, which is made of logic blocks and routing, and a plurality of IOBs 104a–n, 106a–n, 108a–n, 110a–n, 112a–n, 114a–n, 116a–n, and 118a–n coupled thereto for coupling the logic blocks of section 102 to other devices. The collection of all the IOBs will be referenced as 104a–118n.

The IOBs 104a–118n are grouped into banks 122, 124, 126, 128, 130, 132, 134, and 136. The I/O design objects placed in each of banks 122–136 must be compatible. However, different banks may simultaneously operate with different I/O attributes, if required by a user's design.

Figure 2:
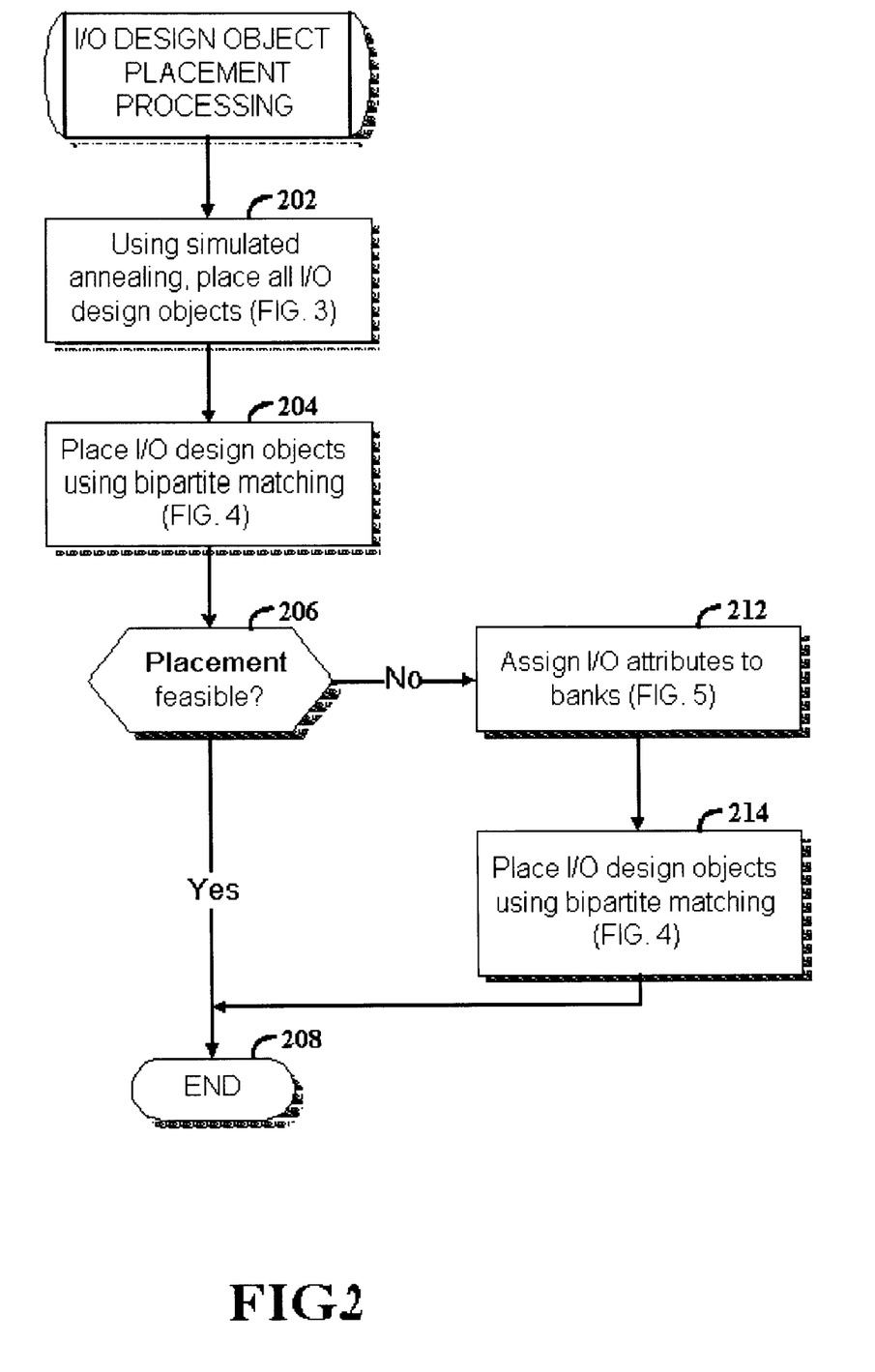
FIG. 2 is a flowchart of a method for placement of I/O design objects into IOBs of an FPGA in accordance with an example embodiment of the present invention.

The present invention places I/O design objects into sites 104a–118n of an FPGA 100 while optimizing the overall placement, in accordance with an example embodiment shown in FIG. 2. The placement of I/O design objects is done such that the quality characteristics are generally optimized and the placement rules are observed. A placement of I/O design objects where the placement rules are not violated is called a "feasible" placement.

The example placement processing of FIG. 2 generally includes three phases. In a first phase of processing shown at step 202, the objects are placed using "simulated annealing." The annealing process is an optimization process for non-linear optimization problems and works well in considering placement of objects into IOBs 104a–118n. The annealing process may produce a result that is feasible. In some cases, however, the result may violate a few placement rules, but the result will be close to a feasible placement. The simulated annealing of step 202 is described further in FIG. 3.

A second phase is then used for placing I/O design objects, as shown in step 204. The second phase of processing includes bipartite matching. Bipartite matching is a process of matching items in a first list to items in a second list. Here, there is a cost associated with any matching or pairing of two items. The bipartite matching algorithm pairs items to minimize the sum of all these costs. Generally, the bipartite matching process assigns attributes to the banks in a way that accounts for the result of the simulated annealing, for example using attributes that are common to a majority of the I/O design objects in a bank in the annealing placement. Then the matching process uses the I/O attributes of the objects and attempts to place the objects such that the I/O attributes of the objects do not conflict with the attributes of the banks into which they are placed.

Figure 4:
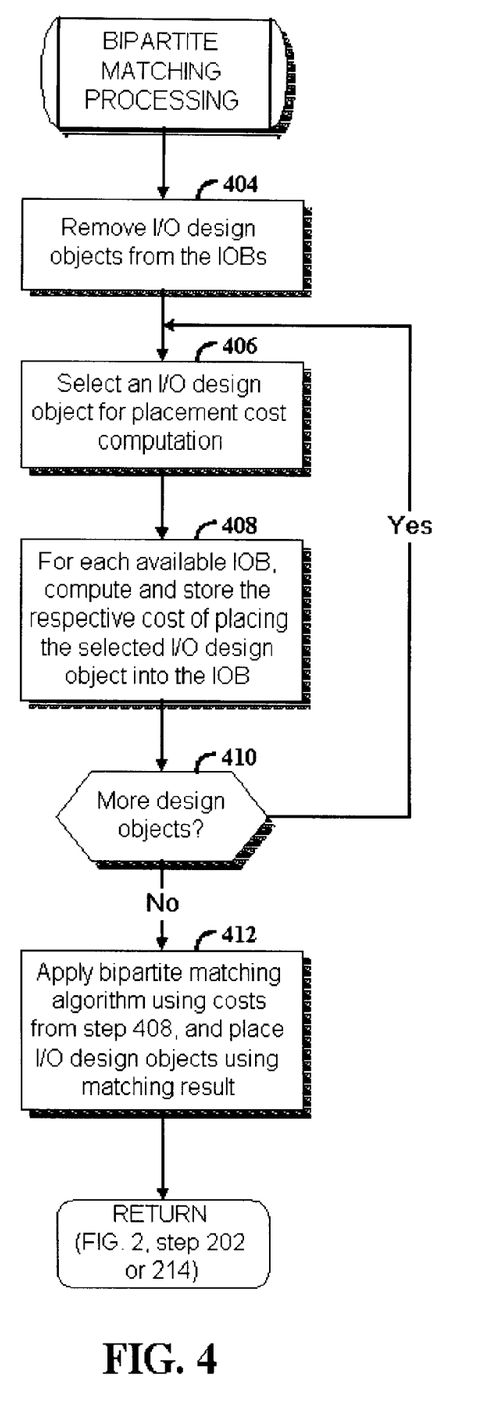
FIG. 4 is a flowchart of a process for bipartite matching of I/O design objects to FPGA IOBs according to an example embodiment of the invention.

If at step 206, all I/O design objects have been placed, and the placement is feasible, then processing is complete. Otherwise, control is directed to steps 212 and 214 where the third phase of the processing is performed. In the final phase of processing, all the I/O attributes are assigned to banks based on the assignments from the simulated annealing processing. The processing of step 212 is further described below in the discussion that accompanies FIGS. 5 and 6. Lastly, the bipartite matching processing of FIG. 4 is repeated as shown by step 214.

Figure 3:
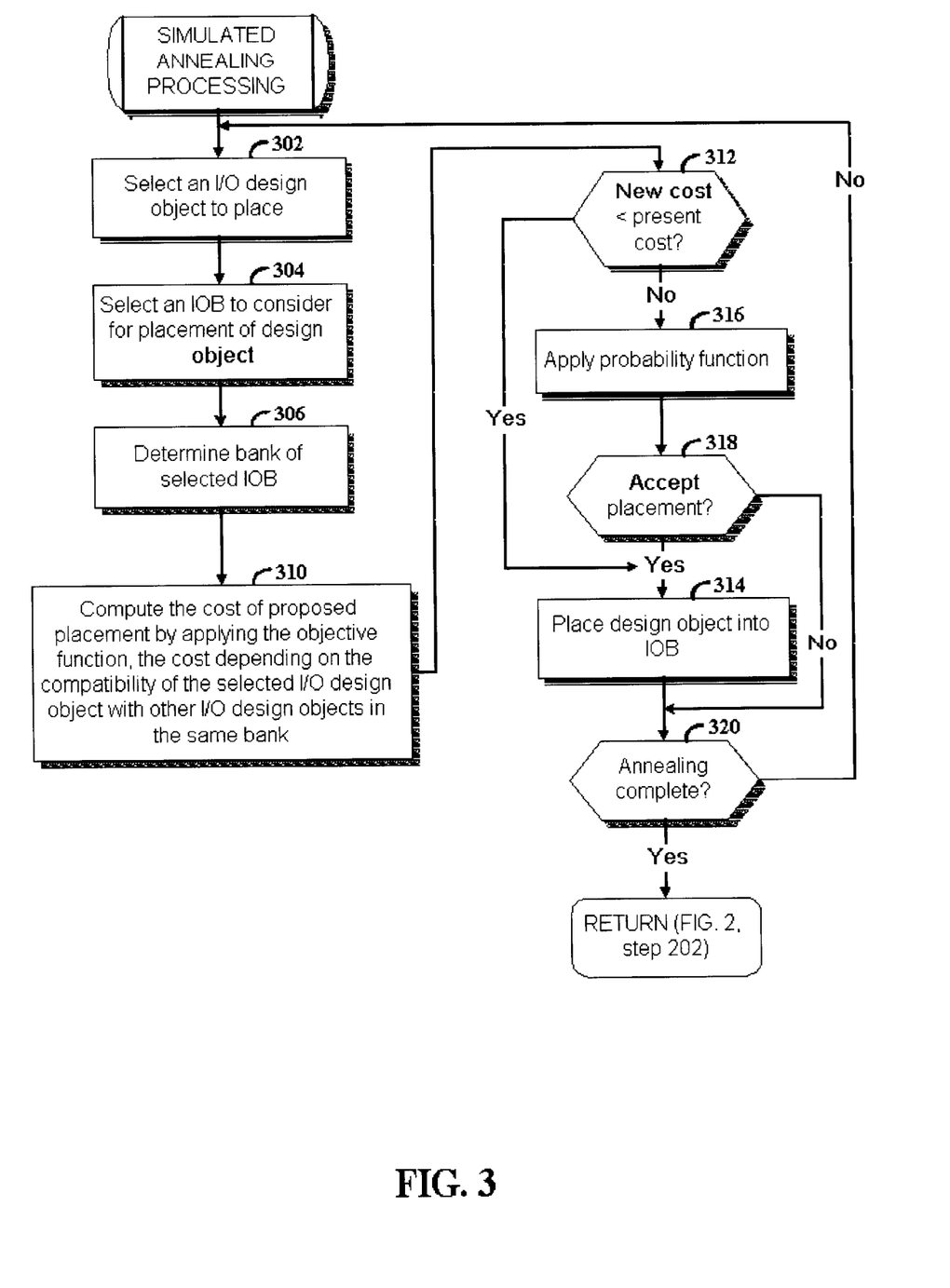
FIG. 3 is a flowchart of an example process for performing a first phase of placement of I/O design objects.

FIG. 3 is a flowchart of a process for performing the first phase of simulated annealing processing for placement of I/O design objects. The first phase of processing uses simulated annealing to attempt to meet I/O attribute compatibility requirements while optimizing placement. Example methods for simulated annealing are described by S. Kirkpatrick, C. D. Gelatt, and M. P. Vecci in "Optimization by Simulated Annealing", Science 220:671–680, May 1983.

Simulated annealing is an iterative process which begins with an initial arbitrary placement of I/O design objects into IOBs 104a–118n. An I/O design object is selected at step 302 and placement of the I/O design object into an arbitrary one of the IOBs 104a–118n is considered at step 304. An objective function is used to determine whether to place the selected I/O design object into the selected IOB. In one embodiment, an objective function yields a quantification of the quality of placing I/O design objects into the FPGA. The objective function includes several terms, each term indicative of a selected quality characteristic of the placement. Example terms reflect the quality of wireability, wire length, and timing characteristics. The Naveed Sherwani book, ibid, can be consulted for a discussion of suitable objective functions.

In one embodiment, the objective function includes a term dedicated to meeting the I/O compatibility requirements. This term penalizes placements having incompatible I/O design. objects placed together in the same bank. The amount of penalty is proportional to the number of incompatible design objects placed together in the same bank, thus causing the penalty to be reduced gradually as incompatibilities are eliminated.

In another embodiment, the total number of IOBs required by the design is factored into the cost function. Since it is desirable to use as few IOBs as possible, an additional term of the cost function aims to minimize the number of IOBs that are used for receiving reference voltages, such as $V_{ref}$. This can be accomplished by spreading the I/O design objects that require a reference voltage across as few banks as possible.

Step 306 determines the bank in which the IOB is located. At step 310, the cost of the proposed placement is determined as described above.

If the cost of the proposed placement is less than the cost of the present placement (decision step 312), then the I/O design object is placed into the selected IOB (step 314). If another I/O design object does not already occupy the IOB, the I/O design object will be placed into the IOB. If another I/O design object occupies the IOB, the new cost is computed where the selected I/O design object is assumed to be placed into the selected IOB, and the I/O design object already in the selected IOB is assumed to be placed into the IOB of the selected I/O design object. In other words, the new cost is computed based on swapping placement of the selected I/O design object and another I/O design object.

If the new cost is not less than the present cost, the process is directed to step 316, where the proposed placement may be accepted even though the result of the objective function is greater. One of the characteristics of simulated annealing is that it allows a controlled acceptance of moves that increase the cost. Early in the annealing process it is more likely than later in the annealing process that a move with a resulting increase in cost is accepted. To implement this feature, a "probability" function is applied to the result of the objective function of the proposed placement, as described by Kirkpatrick et al, ibid.

At step 316, the probability function is applied. If the result of the probability function is within an acceptable range, step 318 directs control to step 314. Otherwise, the I/O design object is not placed into the IOB, and control is directed to decision step 320. Decision step 320 tests whether annealing is complete with generally known techniques, and when annealing is complete, control is returned to step 202 of FIG. 2.

FIG. 4 is a flowchart of a process for bipartite matching of I/O design objects to FPGA IOBs according to an example embodiment of the invention. The bipartite matching process attempts to place I/O design objects into IOBs 104a–118n within banks 122–136 in a manner that minimizes an objective function while maintaining compatibility between the I/O attributes of the I/O design objects and the I/O attributes of the banks in which the I/O design objects are placed.

At step 404, the I/O design objects are removed from placement in the IOBs 104a–118n after assigning attributes to the banks based on the present placement (e.g., by majority). The I/O design objects will then be placed again according to the bipartite matching process. An I/O design object is selected for computation of costs at step 406, and at step 408 respective costs are computed for placement of the I/O design object into the IOBs 104a–118n. The respective costs are stored in a table, for example, for later use in bipartite matching. In one embodiment, the cost function for bipartite matching is similar to the cost function for the simulated annealing.

In an example embodiment, the objective function includes a cost calculation that is based on majorities of compatible design attributes. For example, if there are three I/O design objects in a bank and two of the objects have a $V_{REF}$ attribute of 2.5 volts and the third object has a $V_{REF}$ attribute of 1.5 volts, the majority $V_{REF}$ attribute is 2.5 volts. If an I/O design object having a $V_{REF}$ attribute other than the majority attribute is placed on an IOB in the bank, a high cost is associated with the placement to guide the process away from placing the I/O design object in the bank.

While there are still more I/O design objects for which to compute costs, step 410 returns control to step 406. When costs for all the I/O design objects have been computed, control is directed to step 412.

A generally known bipartite matching is performed on the costs associated with all the I/O design objects and the IOBs 104a–118n. The bipartite matching provides a placement of all I/O design objects such that the overall cost is minimized, where the overall cost is, for example, the sum of the individual placement costs of the I/O design objects into the IOBs selected for the placement. Bipartite matching methods such as those described by Thomas H. Cormen, Charles, E. Leiserson, and Ronald L. Rivest in "Introduction to Algorithms", McGraw Hill, 1997 or by Robert Endre Tarjan in "Data Structures and Network Algorithms", Society of International Applied Mathematics, 1983, for example, are acceptable. When bipartite matching is complete, control is returned to step 204 of FIG. 2.

Figures 5, 6:
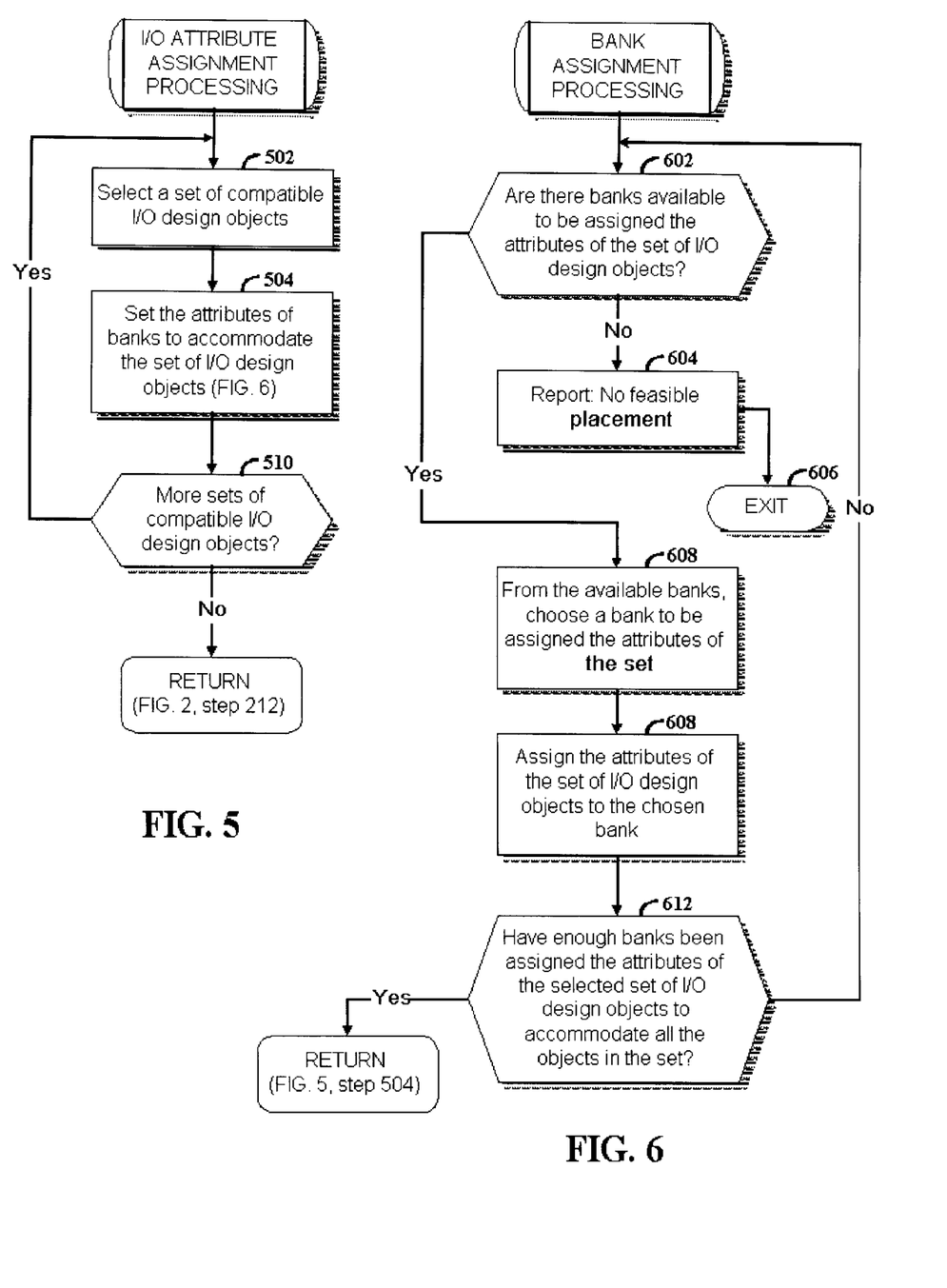
FIG. 5 is a flowchart of an example method for assigning I/O attributes required by a design to banks of an FPGA.
FIG. 6 shows a flowchart of an example method for selecting banks for assignment of compatible I/O attributes.

FIG. 5 is a flowchart of an example method for assigning I/O attributes required by a design to banks 122–136 of an FPGA 100. If the bipartite matching process fails (FIG. 1) to find a feasible placement of I/O design objects into banks, a third phase of processing is performed wherein the I/O attributes are assigned to banks based on the previously attempted placements.

At step 502, a set of I/O design objects having compatible I/O attributes is selected. At step 506, the attributes of the selected set of objects are assigned to one or more banks of IOBs, as further described in FIG. 6. Once a bank is assigned the attributes of the set, I/O design objects within the set are allowed to be placed in the IOBs of the bank.

As shown in FIG. 6, at step 602, there is a determination of whether banks are available that can be assigned the I/O attributes of the selected set of design objects. If no bank is available, at step 604 a report is made that there is no feasible placement, and the process exits at step 606. Assuming that banks are available, at step 608, an available bank is selected for assignment of the I/O attributes. At step 608, the I/O attributes of the set of I/O design objects are assigned to the bank. At step 612 a determination is made of whether the number of banks assigned the set of I/O attributes are sufficient for placement of all design objects in the set. If not, control returns to step 602. Otherwise, control is returned to the process of FIG. 5.

Returning now to FIG. 5, while there are more sets of I/O design objects with compatible I/O attributes, step 510 returns control to step 502. Once a sufficient number of IOBs have been reserved for the I/O attributes of the different sets of I/O design objects, the process returns to the placement process of FIG. 2.

Accordingly, the present invention provides, among other aspects, a method and system for placement of I/O design objects into a programmable gate array. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for placement of I/O design objects into IOBs of a programmable gate array, the IOBs of the programmable gate array arranged in a plurality of banks and programmable to send and receive signals at a plurality of different electrical characteristics, wherein the design objects have associated therewith I/O attributes indicative of required electrical characteristics, comprising:

selecting sets of I/O design objects, wherein the I/O design objects in each set have compatible I/O attributes, wherein the I/O attributes of at least one set of design objects are incompatible with the I/O attributes of at least one other set of design objects;

assigning compatible I/O attributes to respective sets of the banks consistent with the I/O attributes of the sets of I/O design objects; and placing the I/O design objects into respective IOBs of the banks while minimizing a placement cost and maintaining compatibility of the I/O attributes between I/O design objects placed within the banks and compatibility between the I/O attributes of the placed I/O design objects and the I/O attributes of the banks.

2. The method of claim 1, further comprising:

establishing an arbitrary initial placement of I/O design objects into the respective IOBs;

selecting one of the I/O design objects;

selecting an IOB for consideration for placement of the I/O design object;

determining the bank in which the IOB is located;

determining a hypothetical placement cost if the I/O design object were to be placed into the IOB, the cost being a function of conflicts between I/O attributes of the I/O design object and I/O attributes of other I/O design objects presently placed into other IOBs of the bank; and placing the I/O design object into the IOB to provide a new placement if the hypothetical placement cost is acceptable.

3. The method of claim 2, wherein the cost is a function of a total number of conflicts between I/O design objects in all banks.

4. The method of claim 2, wherein the cost is a function of a total number of IOBs used by the I/O design objects.

5. The method of claim 2, further comprising:

identifying a set of I/O attributes that are common to a majority of the I/O design objects placed on the IOBs of the bank, wherein the cost is a function of a total number of I/O design objects placed on the IOBs of the bank that have I/O attributes that are incompatible with the set of I/O attributes.

6. The method of claim 1, further comprising:

initially placing the I/O design objects on the IOBs, whereby a present placement is established;

assigning I/O attributes to the banks based on the present placement;

removing the I/O design objects from the present placement; and establishing respective placement costs of all I/O design objects into all IOBs, wherein minimizing the placement cost in the placing step is a function of the respective placement costs.

7. The method of claim 6, further comprising performing bipartite matching in minimizing the placement cost.

8. An apparatus for placement of I/O design objects into IOBs of a programmable gate array, the IOBs of the programmable gate array arranged in a plurality of banks and programmable to send and receive signals at a plurality of different electrical characteristics, wherein the design objects have associated therewith I/O attributes indicative of required electrical characteristics, comprising:

means for selecting sets of I/O design objects, wherein the I/O design objects in each set have compatible I/O attributes, wherein the I/O attributes of at least one set of design objects are incompatible with the I/O attributes of at least one other set of design objects;

means for assigning compatible I/O attributes to respective sets of the banks consistent with the I/O attributes of the sets of I/O design objects; and means for placing the I/O design objects into respective IOBs of the banks while minimizing a placement cost and maintaining compatibility of the I/O attributes between I/O design objects placed within the banks and compatibility between the I/O attributes of the placed I/O design objects and the I/O attributes of the banks.

9. A method for placement of I/O design objects into IOBs of a programmable gate array, the IOBs of the programmable gate array arranged in a plurality of banks and programmable to send and receive signals at a plurality of different electrical characteristics, wherein the design objects have associated therewith I/O attributes indicative of required electrical characteristics, comprising:

generating an intermediate placement of the I/O design objects on the IOBs while permitting placement of I/O design objects having incompatible I/O attributes within a bank, wherein the I/O attributes of at least one set of I/O design objects are incompatible with the I/O attributes of at least one other set of I/O design objects;

assigning sets of I/O attributes to respective ones of the banks while optimizing placement of the design objects, wherein each set of I/O attributes define the electrical characteristics of IOBs within the bank; and placing I/O design objects into respective IOBs of banks for a final placement, wherein the I/O attributes of the I/O design object is compatible with the I/O attributes of the bank in which the respective IOB is located.

10. A method for placement of I/O design objects into IOBs of a programmable gate array, the IOBs of the programmable gate array arranged in a plurality of banks and programmable to send and receive signals at a plurality of different electrical characteristics, wherein the design objects have associated therewith I/O attributes indicative of required electrical characteristics, comprising:

generating an intermediate placement of the I/O design objects on the IOBs while permitting placement of I/O design objects having incompatible I/O attributes within a bank, wherein the I/O attributes of at least one set of I/O design objects are incompatible with the I/O attributes of at least one other set of I/O design objects;

assigning sets of I/O attributes to respective ones of the banks as a function of the intermediate placement, wherein each set of I/O attributes define the electrical characteristics of IOBs within the bank; and generating a final placement of the I/O design objects while minimizing cost of the final placement and maintaining compatibility of the I/O attributes between I/O design objects placed within the banks and compatibility between the I/O attributes of the placed I/O design objects and the I/O attributes of the banks.

* * * * *